United States Patent
Cho (10) Patent No.: US 8,310,026 B2
(45) Date of Patent: Nov. 13, 2012

(54) SEMICONDUCTOR DEVICE AND METHOD FOR FABRICATING THE SAME

(75) Inventor: Jin-Youn Cho, Chungcheongbuk-do (KR)

(73) Assignee: Magnachip Semiconductor, Ltd. (KR)

( * ) Notice: Subject to any disclaimer, the term of this patent is extended or adjusted under 35 U.S.C. 154(b) by 0 days.

(21) Appl. No.: 12/690,813

(22) Filed: Jan. 20, 2010

(65) Prior Publication Data

US 2010/0117197 A1 May 13, 2010

Related U.S. Application Data

(62) Division of application No. 11/301,992, filed on Dec. 12, 2005, now Pat. No. 7,683,415.

(30) Foreign Application Priority Data

Dec. 30, 2004 (KR) .............................. 2004-0116971

(51) Int. Cl.
*H01L 29/92* (2006.01)
(52) U.S. Cl. ......... 257/532; 257/301; 257/302; 257/303
(58) Field of Classification Search .................. 257/301, 257/302, 303, 232
See application file for complete search history.

(56) References Cited

U.S. PATENT DOCUMENTS

| | | | |
|---|---|---|---|
| 5,812,364 A | 9/1998 | Oku et al. | |
| 6,144,051 A * | 11/2000 | Nishimura et al. | 257/277 |
| 6,319,767 B1 | 11/2001 | Cha et al. | |
| 6,353,269 B1 | 3/2002 | Huang | 257/296 |
| 6,483,691 B1 | 11/2002 | Nakamura | |
| 6,913,965 B2 * | 7/2005 | Abadeer et al. | 438/239 |
| 6,982,472 B2 * | 1/2006 | Kiyotoshi | 257/532 |
| 7,220,600 B2 * | 5/2007 | Summerfelt et al. | 438/3 |
| 7,242,094 B2 | 7/2007 | Matsunaga et al. | |
| 7,282,404 B2 * | 10/2007 | Coolbaugh et al. | 438/239 |
| 7,294,544 B1 * | 11/2007 | Ho et al. | 438/250 |
| 7,326,987 B2 * | 2/2008 | Abadeer et al. | 257/306 |
| 2001/0026003 A1 | 10/2001 | Yoshitomi et al. | |
| 2002/0022335 A1 | 2/2002 | Chen | 438/396 |
| 2002/0179951 A1 * | 12/2002 | Yoshiyama et al. | 257/303 |
| 2003/0008467 A1 * | 1/2003 | Kai et al. | 438/393 |
| 2004/0079980 A1 * | 4/2004 | Hieda | 257/303 |
| 2004/0207043 A1 * | 10/2004 | Matsunaga et al. | 257/534 |
| 2005/0029566 A1 * | 2/2005 | Chen et al. | 257/296 |
| 2006/0138595 A1 * | 6/2006 | Kiyotoshi | 257/532 |
| 2007/0228573 A1 | 10/2007 | Matsunaga et al. | |

FOREIGN PATENT DOCUMENTS

| | | |
|---|---|---|
| CN | 1405877 | 3/2003 |
| JP | 10-321721 | 12/1998 |
| JP | 2000-235973 | 8/2000 |
| JP | 2000-353804 | 12/2000 |
| JP | 2001-237400 | 8/2001 |

(Continued)

*Primary Examiner* — Matthew W Such
*Assistant Examiner* — David Spalla
(74) *Attorney, Agent, or Firm* — Blakely, Sokoloff, Taylor & Zafman (57) ABSTRACT

A semiconductor device and a method for fabricating the same are provided. The method includes: forming a contact plug passing through an inter-layer insulation layer; sequentially forming a lower electrode layer, a dielectric layer and an upper electrode layer on the inter-layer insulation layer; patterning the upper electrode layer; patterning the dielectric layer and the lower electrode layer, thereby obtaining a capacitor including an upper electrode, a patterned dielectric layer and a lower electrode; and sequentially forming a first metal interconnection line connected with the contact plug and second metal interconnection lines connected with the capacitor.

13 Claims, 11 Drawing Sheets

FOREIGN PATENT DOCUMENTS

| | | |
|---|---|---|
| JP | 2001-274340 | 10/2001 |
| JP | 2002-353328 | 12/2002 |
| JP | 2003-109948 | 4/2003 |
| JP | 2003-133414 | 5/2003 |
| JP | 2004-063667 | 2/2004 |
| TW | 483140 | 4/2002 |
| TW | 543175 | 7/2003 |
| TW | 200403848 | 3/2004 |

* cited by examiner

SEMICONDUCTOR DEVICE AND METHOD FOR FABRICATING THE SAME

CROSS-REFERENCE TO RELATED APPLICATION

The present patent application is a Divisional application claiming the benefit of application Ser. No. 11/301,992, filed Dec. 12, 2005 now U.S. Pat. No. 7,683,415.

FIELD OF THE INVENTION

The present invention relates to a semiconductor device and a method for fabricating the same; and, more particularly, to a semiconductor device and a method for fabricating the same, wherein the semiconductor device includes a metal-insulator-metal capacitor formed before a metal interconnection line is formed.

DESCRIPTION OF RELATED ART

Analog capacitors applied to integrated circuit (IC) logic devices of complementary metal oxide semiconductor (CMOS) image sensors generally require high accuracy. Such semiconductor technology is essential in technical fields related to analog-to-digital (AD) converters and switched capacitor filters.

There have been various capacitor structures including a structure of polysilicon to polysilicon, a structure of polysilicon to silicon, a structure of metal to silicon, a structure of metal to polysilicon, a structure of metal to metal, and a structure of metal-insulation-metal (MIM). Among these capacitor structures, since the structure of metal to metal or the MIM structure has a low level of series resistance, capacitors with high capacitance can be formed. Also, the structure of metal to metal or the MIM structure has thermal stability and a low level of power supply voltage (VCC) and thus, these structures are frequently used for the analog capacitors. Particularly, capacitors with the MIM structure are commonly allocated between metal interconnection lines. However, it is often complicated to form the MIM type capacitors in the Cu Back-end-of-Line (BEOL), thereby increasing a defect generation. As a result, a yield rate of semiconductor devices may be reduced.

FIGS. 1A to 1E are cross-sectional views of a conventional semiconductor device for illustrating a method for fabricating the same.

Figure 1A:
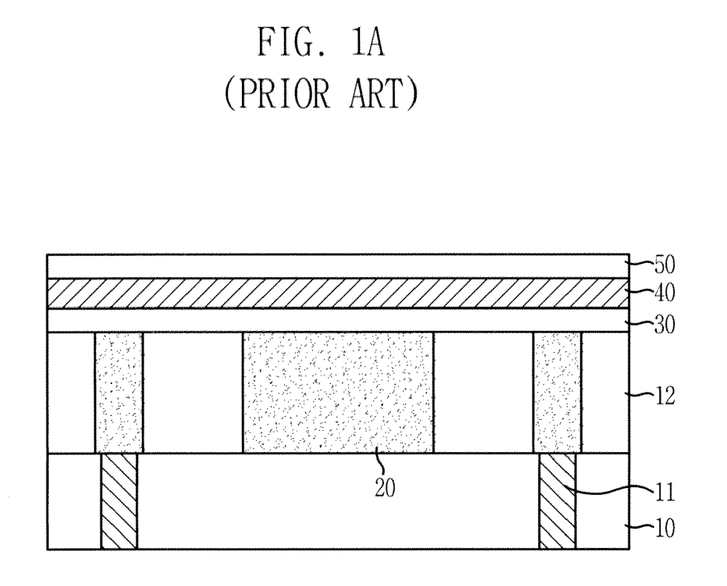
FIGS. 1A to 1E are cross-sectional views of a conventional semiconductor device for illustrating a method for fabricating the same.

Referring to FIG. 1A, a plurality of contact plugs 11 are formed to pass through a first inter-layer insulation layer 10. On the contact plugs 11, a second inter-layer insulation layer 12 and a plurality of first metal interconnection lines 20 are formed by performing a damascene process. A lower electrode layer 30, a dielectric layer 40 and an upper electrode layer 50 are sequentially formed on the second inter-layer insulation layer 12 and on the plurality of first interconnection lines 20 in order to form a MIM type capacitor.

The lower electrode layer 30 and the upper electrode layer 50 are formed by a physical vapor deposition (PVD) method, whereas the dielectric layer 40 is formed by a chemical vapor deposition (CVD) method. The lower electrode layer 30 and the upper electrode layer 50 are formed of tantalum nitride (TaN) or titanium nitride (TiN), and the dielectric layer 40 is formed of nitride, oxide, aluminum oxide ($Al_2O_3$), hafnium oxide ($HfO_2$), zirconium oxide ($ZrO_2$), and tantalum oxide ($Ta_2O_5$).

Figure 1B:
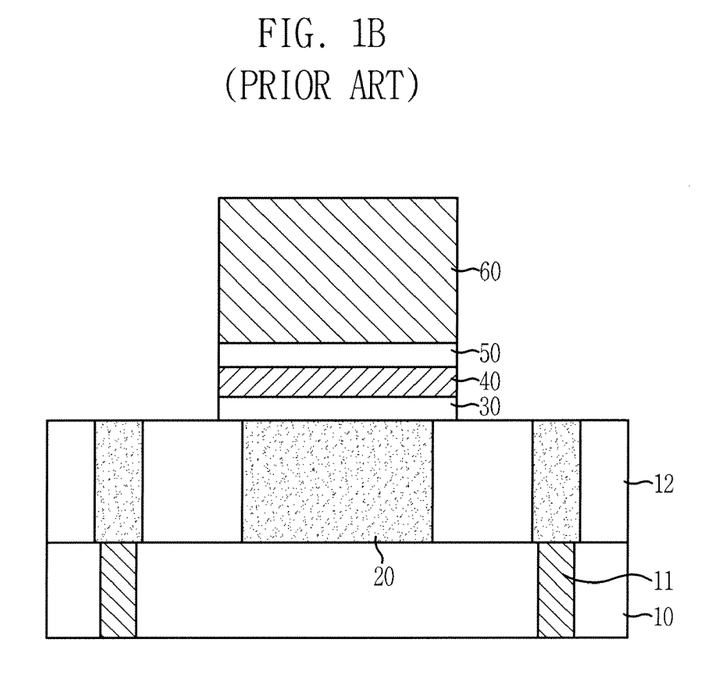

Referring to FIG. 1B, a first photoresist pattern 60 is formed on the upper electrode layer 50. Using a mixture gas of $Cl_2/BCl_3$, the upper electrode layer 50 is etched. The dielectric layer 40 is then etched by using a mixture gas of $CF_4/O_2/Ar$ or a mixture gas of $CHF_3/O_2/Ar$. The lower electrode layer 30 is then etched with using a mixture gas of $Cl_2/BCl_3$. The MIM structure formed as above is designed to be connected with one of the first metal interconnection lines 20.

Figure 1C:
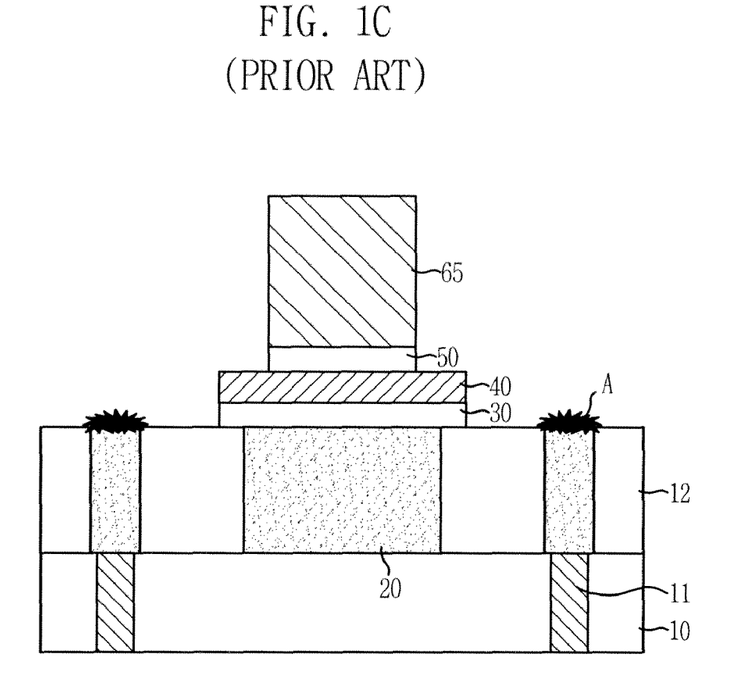

Referring to FIG. 1C, the first photoresist pattern 60 is removed using $O_2$ plasma or $O_3$, and a wet cleaning process is performed thereafter. A second photoresist pattern 65 is formed on the upper electrode layer 50, and using a mixture gas of $Cl_2/BCl_3$, the upper electrode layer 50 is etched. However, the etching of the upper electrode layer 50 may damage those first metal interconnection lines 20 exposed by the above etching process for forming the MIM type capacitor structure. This damage is illustrated with a reference denotation A.

Figure 1D:
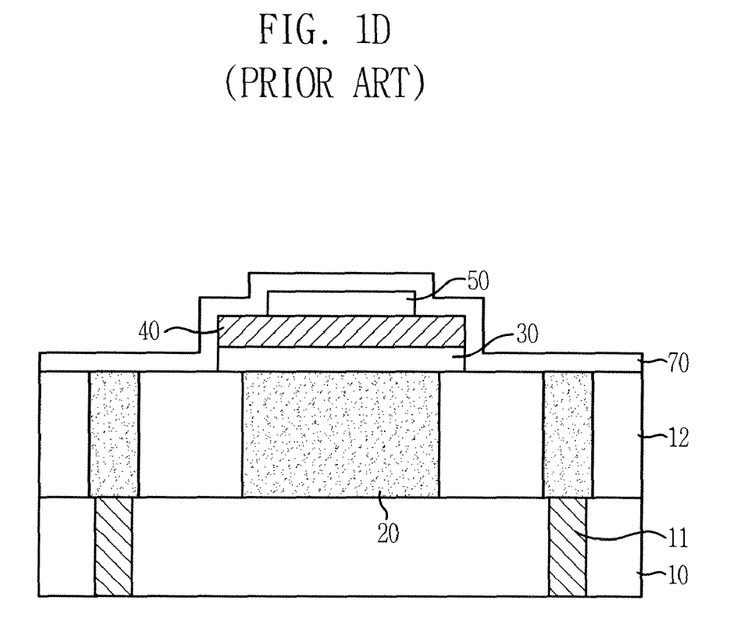

Referring to FIG. 1D, a diffusion barrier layer 70 is formed over the above resulting structure in order to prevent an extension of the first metal interconnection lines 20.

Figure 1E:
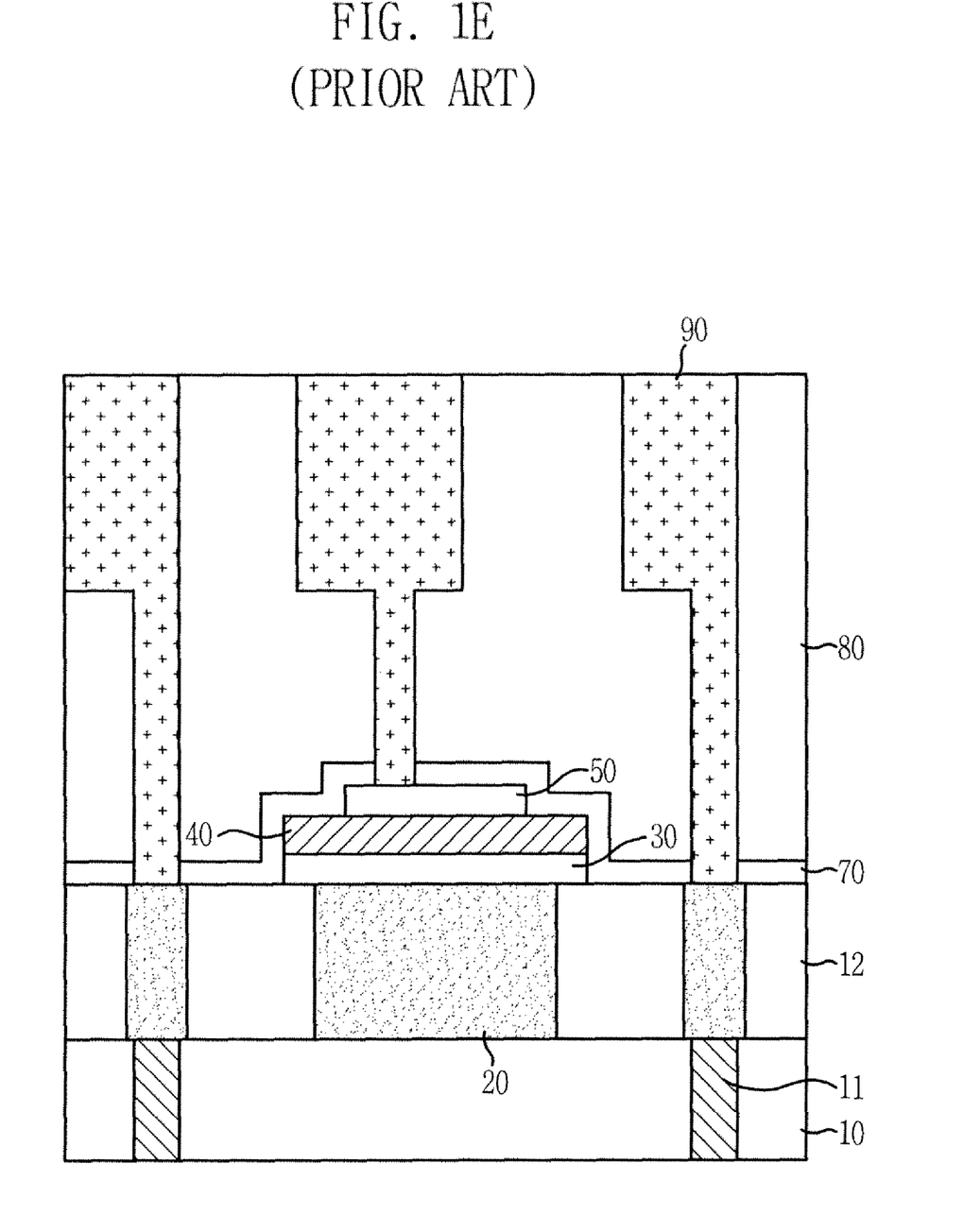

Referring to FIG. 1E, an inter-metal insulation layer 80 is formed on the above resulting structure, and a plurality of second metal interconnection lines are formed through performing a damascene process.

The above conventional method for fabricating the type capacitor may have critical defects such as an electric short event or an electric disconnection when the etching of the upper electrode layer 50, the removal of the first photoresist pattern 60 using $O_2$ plasma or $O_3$ and the wet cleaning of the substrate structure are performed while the first metal interconnection lines 20 are exposed. The defects may become a cause for decreasing reliability of semiconductor devices.

An additional photoresist mask that does not expose the first metal interconnection lines 20 is required to prevent the above defects. However, the additional use of the photoresist mask makes the capacitor fabrication process complicated, and it is difficult to fabricate such photoresist mask that masks only the first metal interconnection lines 20. Therefore, the MIM type capacitor is formed after a barrier layer is formed on the first metal interconnection lines 20.

FIGS. 2A to 2H are cross-sectional views illustrating another conventional method for fabricating a semiconductor device. Herein, the same reference numerals are used for the same elements described in FIGS. 1A to 1E.

Figure 2A:
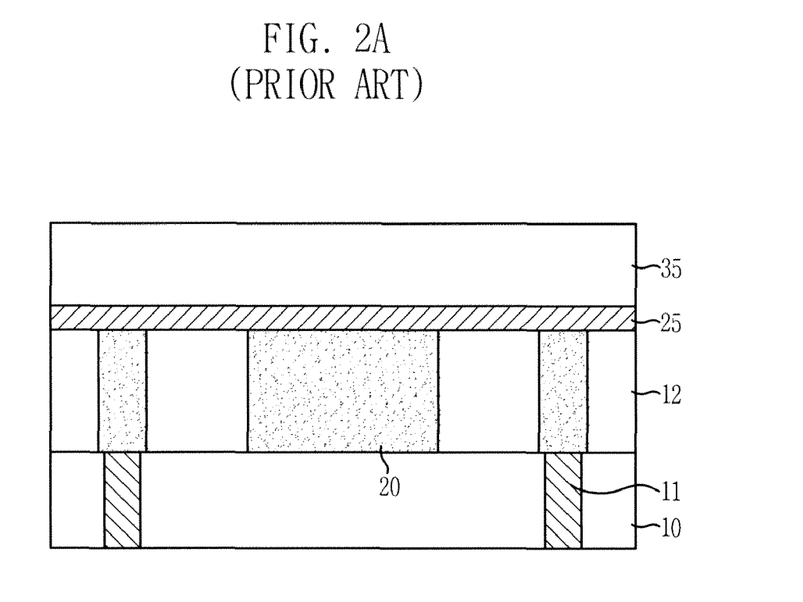
FIGS. 2A to 2H are cross-sectional views of a conventional semiconductor device for illustrating a method for fabricating the same.

Referring to FIG. 2A, a plurality of contact plugs 11 are formed to pass through a first inter-layer insulation layer 10. On the contact plugs 11, a second inter-layer insulation layer 12 and a plurality of first metal interconnection lines 20 are formed by performing a damascene process. A diffusion barrier layer 25 formed of nitride is formed in a thickness of approximately 200 Å to approximately 700 Å on the second inter-layer insulation layer 12 and on the first metal interconnection lines 20. An oxide layer 35 obtained through a CVD method is formed on the diffusion barrier layer 25. The oxide layer 35 has a thickness of approximately 1,000 Å to approximately 5,000 Å.

Figure 2B:
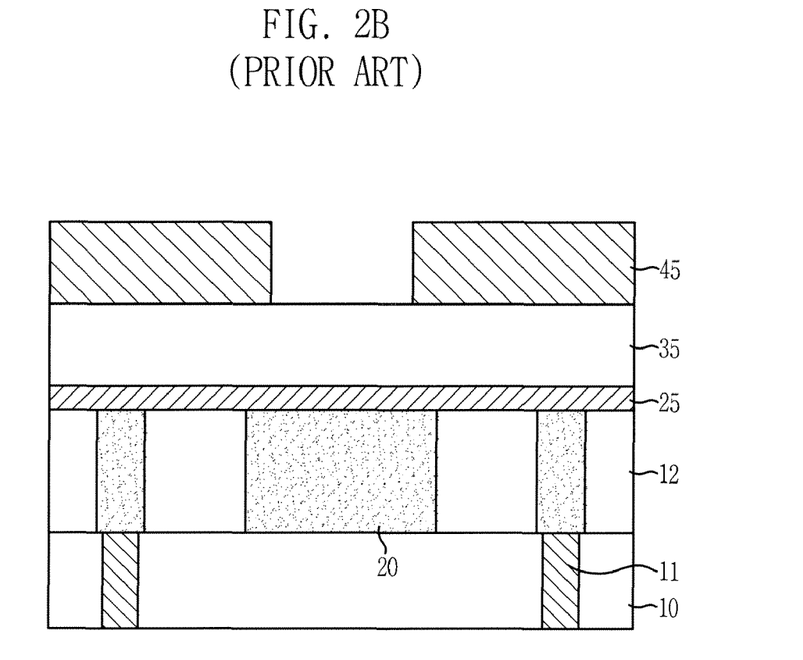

Referring to FIG. 2B, a first photoresist pattern 45 is formed on the oxide layer 35 such that the first photoresist pattern 45 exposes a portion of the oxide layer 35 at which one of the first metal interconnection lines 20 is to be connected with a MIM type capacitor.

Figure 2C:
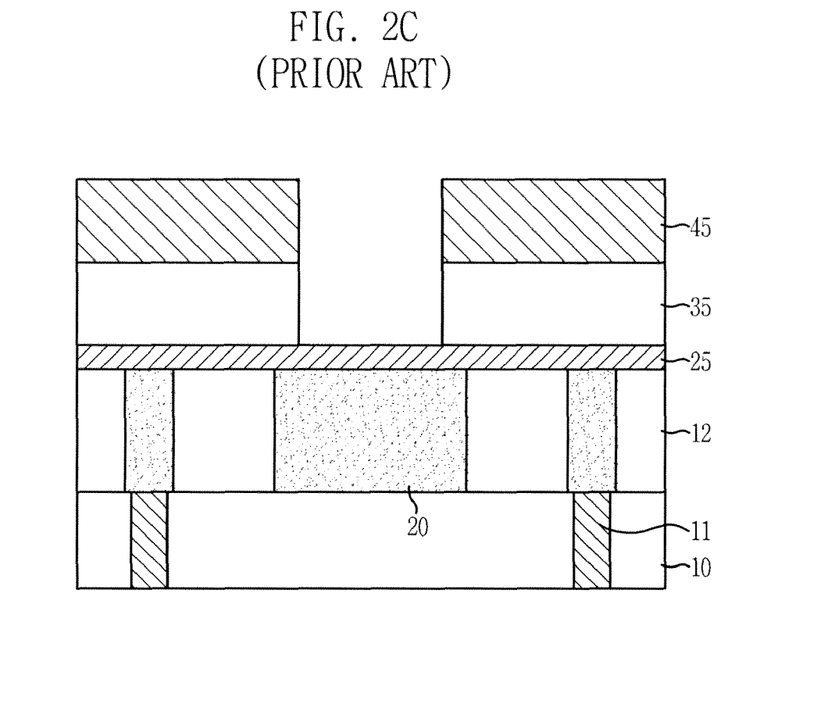

Referring to FIG. 2C, the oxide layer 35 is etched using the first photoresist pattern 45 as an etch mask. If a lower electrode layer of the MIM type capacitor is formed of TaN, because of an opaque property of TaN, overlay keys or alignment keys used for forming a photoresist pattern for forming the MIM type capacitor may not be seen after the TaN layer (i.e., the lower electrode layer) is formed. Therefore, prior to forming the TaN layer, an etching of the oxide layer 35 and an etching of overlay keys or alignment keys are performed simultaneously to form the deep overlay keys or alignment keys.

The etching of the overlay keys or alignment keys is carried out under a recipe of using a mixture of gas $CHF_3/CF_4/O_2/Ar$ or a mixture gas of $CHF_3/O_2/Ar$ and a low etch selectivity ratio of the oxide layer 35 with respect to a nitride layer. The low etch selectivity ratio of the oxide layer 35 makes the above simultaneous etching process not to be stopped at the diffusion barrier layer 25, so that the deep overlay keys or alignment keys can be formed.

Figure 2D:
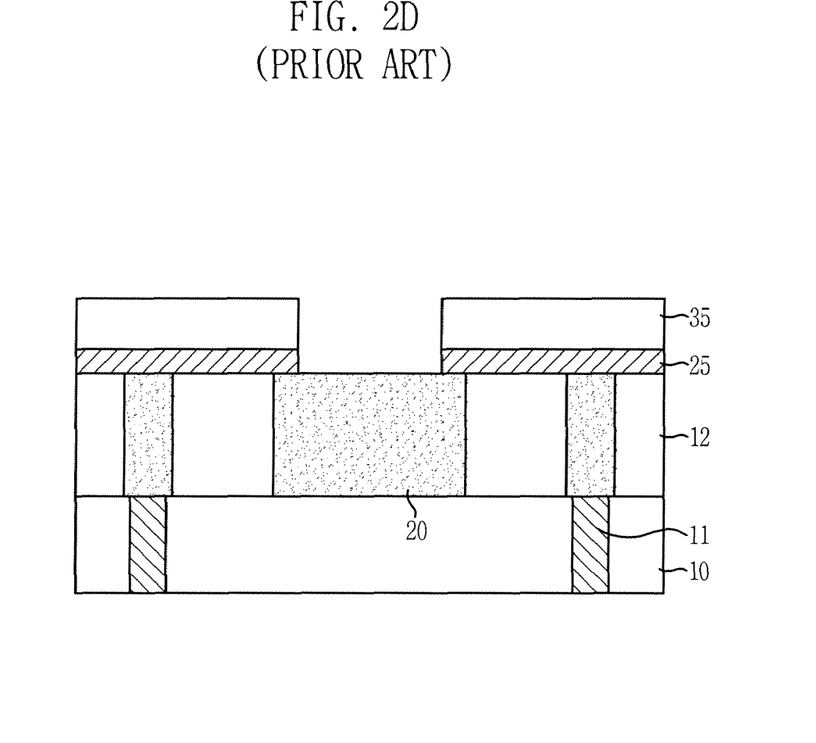

Referring to FIG. 2D, the first photoresist pattern 45 is removed using $O_2$ plasma or $O_3$, and the diffusion barrier layer 25 is etched using the oxide layer 35 as an etch mask. At this time, a mixture gas of $CHF_3/O_2/Ar$ or a mixture gas of $CHF_3/CF_4/O_2/Ar$ is used when the diffusion barrier layer 25 is etched. During the etching of the diffusion barrier layer 25, polymers are generated, and the polymers are removed by a wet cleaning process. Since the oxide layer 35 is used as the etch mask, the total thickness of the oxide layer 35 is reduced after the etching of the diffusion barrier layer 25.

Figure 2E:
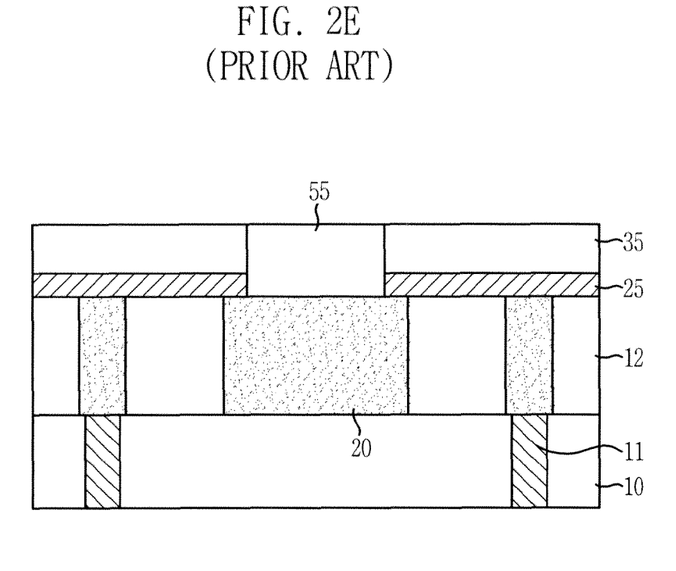

Referring to FIG. 2E, a connector 55 which connects the MIM type capacitor with the selected first metal interconnection line 20 is formed. As like a process for forming metal interconnection lines, a barrier layer for preventing an extension of the patterns and a seed layer for aiding an easy filling of a metal layer are formed to thereby provide the connector 55 connecting the MIM type capacitor with the selected first metal interconnection line 20.

Figure 2F:
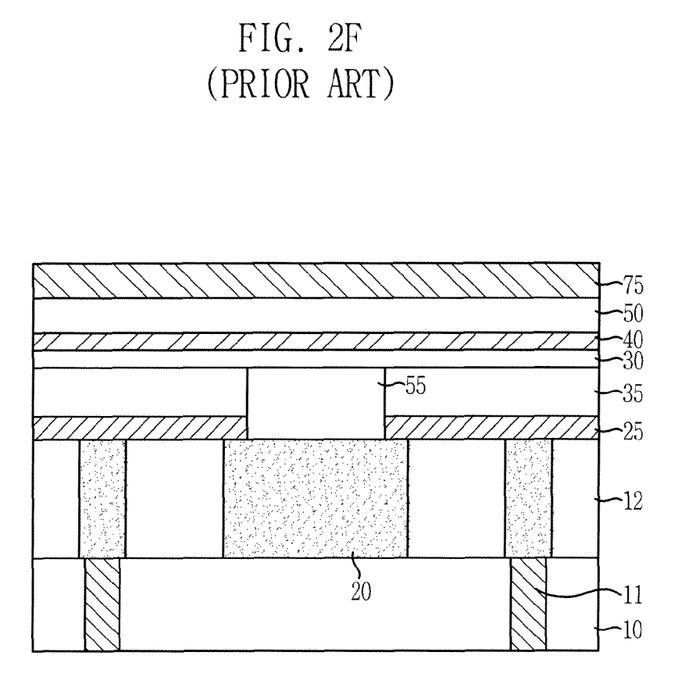

Referring to FIG. 2F, a lower electrode layer 30, a dielectric layer 40, an upper electrode layer 50, and an etch stop layer 75 are formed. The lower electrode layer 30 and the upper electrode layer 50 are formed of TaN, and the dielectric layer 40 is formed of nitride. The etch stop layer 75 is formed to prevent a punch-through event at the upper electrode layer 50 during a damascene process for forming second metal interconnection lines. At this time, a layer of TaN is formed by employing a PVD method, whereas a layer of nitride is formed by employing a CVD method.

Figure 2G:
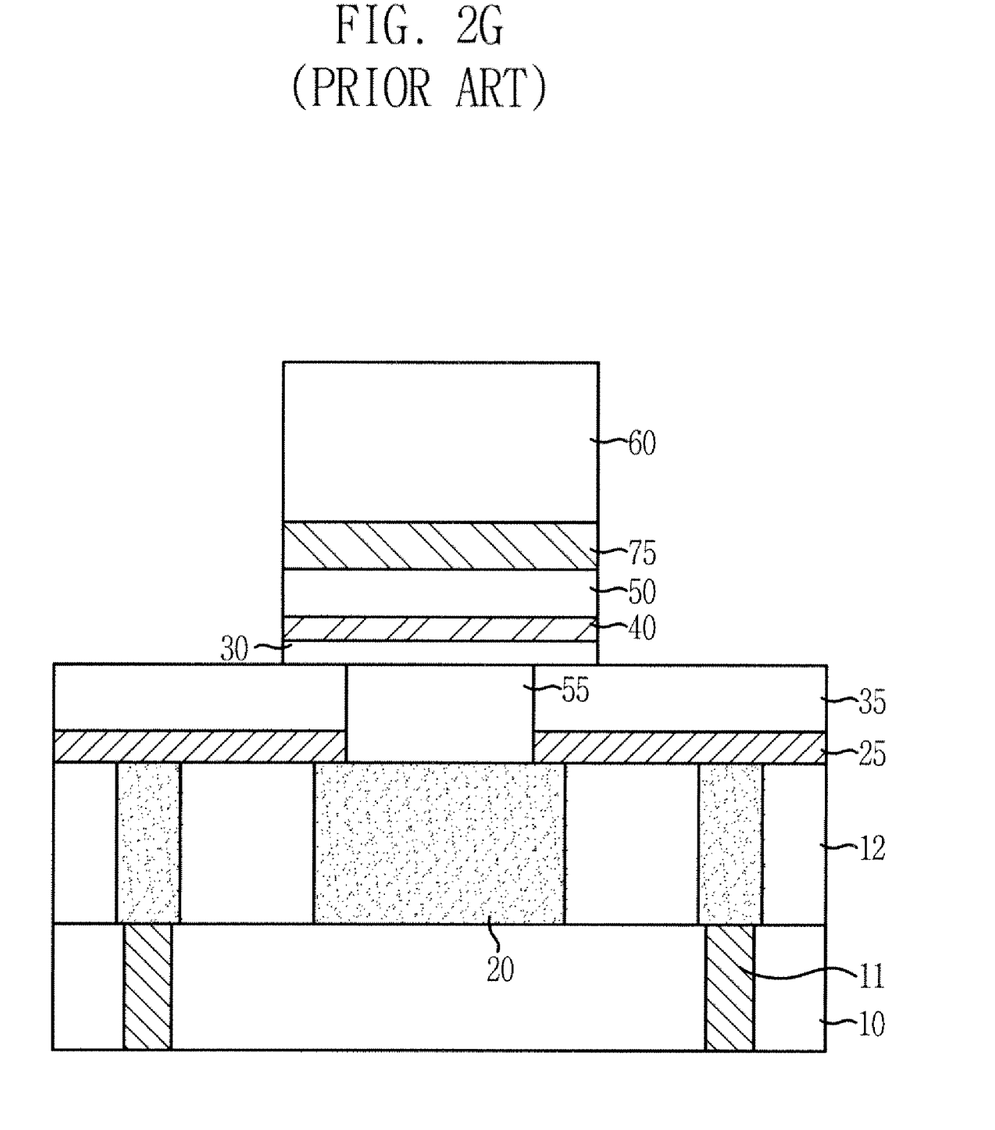

Referring to FIG. 2G, a second photoresist pattern 60 is formed to form the aforementioned MIM type capacitor. The etch stop layer 75 is etched using a mixture gas of $CHF_3/O_2/Ar$ or a mixture gas of $CHF_3/CF_4/O_2/Ar$. A mixture gas of $Cl_2/BCl_3$ is used to etch the upper electrode layer 50 and the lower electrode layer 30, and a mixture gas of $CHF_3/O_2/Ar$ or a mixture gas of $CHF_3/CF_4/O_2/Ar$ is used to etch the dielectric layer 40. After these sequential etching processes for forming the MIM type capacitor, the second photoresist pattern 60 is removed using $O_2$ plasma or $O_3$, and afterwards, a wet cleaning process is performed on the above resulting structure.

Figure 2H:
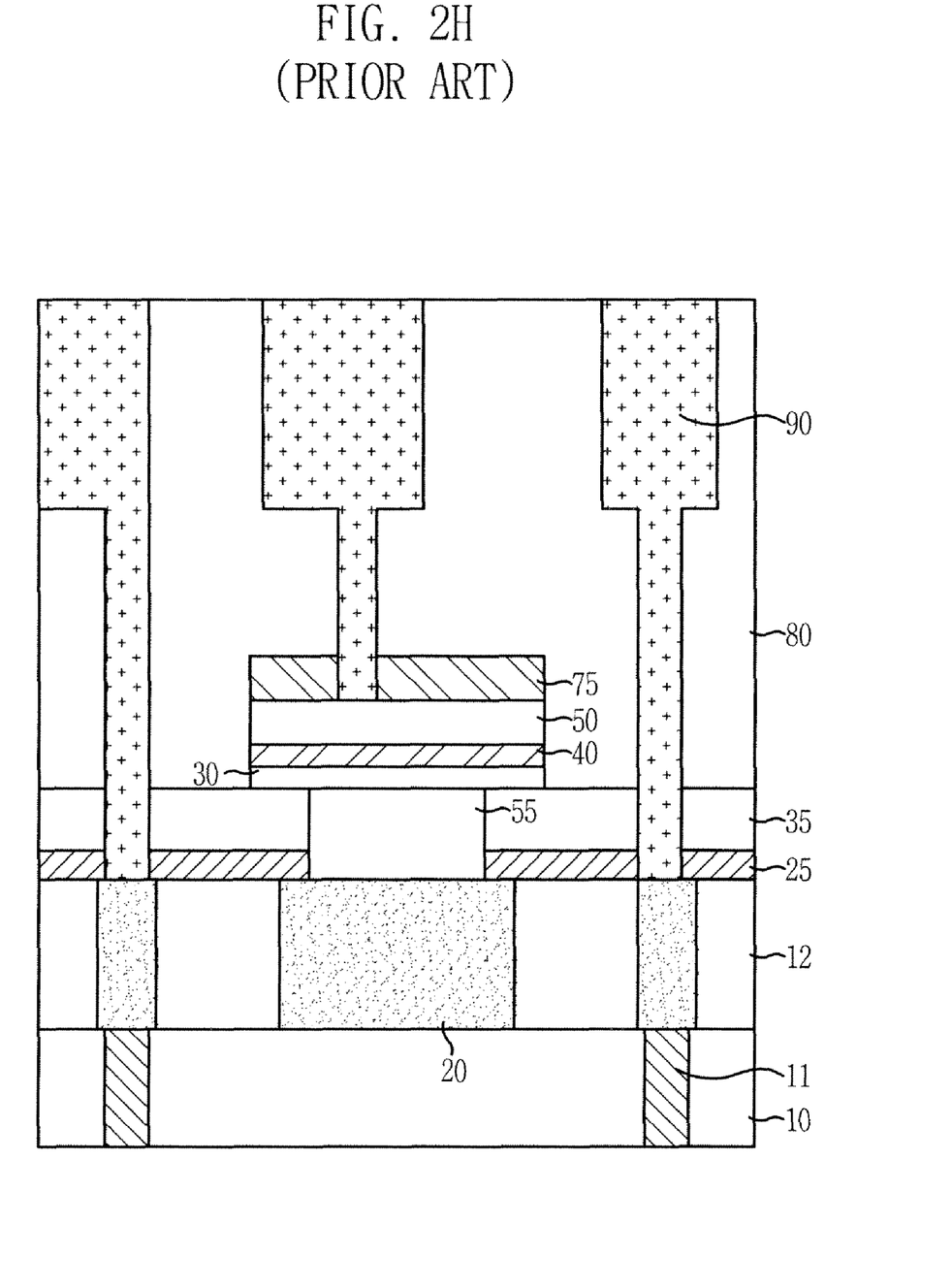

Referring to FIG. 2H, an inter-metal insulation layer 80 is formed on the above resulting structure, and the aforementioned second metal interconnection lines 90 are formed through performing a damascene process.

As described above, prior to forming the MIM type capacitor, the barrier layer is additionally formed to prevent damages on the first metal interconnection lines. However, it is required to form overlay keys or alignment keys additionally, thereby resulting in a complicated fabrication process. Hence, a defect generation is more likely to occur. Also, since a region where the MIM type capacitor is formed is higher than other regions, a process margin for the second metal interconnection line formation may be reduced.

SUMMARY OF THE INVENTION

It is, therefore, an object of the present invention to provide a semiconductor device and a method for fabricating the same, wherein the semiconductor device is obtained by a simplified fabrication process, which forms a MIM type capacitor and then a metal interconnection line, and has an improved device characteristic.

In accordance with an aspect of the present invention, there is provided a method for fabricating a semiconductor device, including: forming a contact plug passing through an inter-layer insulation layer; sequentially forming a lower electrode layer, a dielectric layer and an upper electrode layer on the inter-layer insulation layer; patterning the upper electrode layer; patterning the dielectric layer and the lower electrode layer, thereby obtaining a capacitor including an upper electrode, a patterned dielectric layer and a lower electrode; and sequentially forming a first metal interconnection line connected with the contact plug and second metal interconnection lines connected with the capacitor.

In accordance with another aspect of the present invention, there is provided a semiconductor device, including: a contact plug passing through an inter-layer insulation layer; a capacitor including a lower electrode, a dielectric layer and an upper electrode sequentially formed on the inter-layer insulation layer; a first metal interconnection line formed above the capacitor and connected with the contact plug; and second metal interconnection lines formed above the capacitor and making a separate connection with the lower electrode and the upper electrode.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A semiconductor device and a method for fabricating the same in accordance with exemplary embodiments of the present invention will be described in detail with reference to the accompanying drawings.

FIGS. 3A to 3F are cross-sectional views of a semiconductor device fabricated in accordance with a specific embodiment of the present invention for illustrating a fabrication method thereof.

Figure 3A:
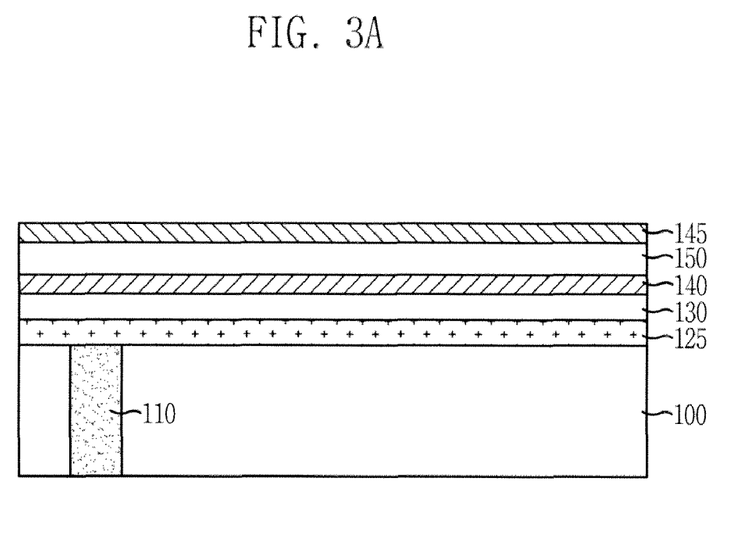
FIGS. 3A to 3F are cross-sectional views of a semiconductor device fabricated in accordance with a specific embodiment of the present invention for illustrating a fabrication method thereof.

Referring to FIG. 3A, a contact plug 110 is formed within an inter-layer insulation layer 100, and a first nitride-based layer 125, a lower electrode layer 130, a dielectric layer 140, an upper electrode layer 150, and a second nitride-based layer 145 are sequentially formed on the contact plug 110 and on the inter-layer insulation layer 100. The lower electrode layer 130 and the upper electrode layer 150 include a material selected from the group consisting of titanium nitride (TiN), tantalum nitride (TaN), aluminum (Al), tungsten (W), and copper (Cu). The dielectric layer 140 includes a material selected from the group consisting of tetraethyl orthosilicate (TEOS), silane, nitride, and oxynitride. The first nitride-based layer 125 and the second nitride-based layer 145 can include a material with an etch selectivity for the dielectric layer 140 with respect to oxide. For instance, the first nitride-based be a nitride layer or an oxynitride layer. Particularly the contact plug 110 is a tungsten plug, the first nitride-based layer 125 serves as an etch stop layer for preventing damage to the contact plug 110 during subsequent sequential processes (i.e., an etching process of the lower electrode layer 130, a photoresist pattern stripping process and a cleaning process, and detailed description thereof will be provided later). The second nitride-based layer 145 also serves as a hard mask layer and as an etch stop layer for minimizing damage to a top electrode when an etching process is performed to form first metal interconnection lines.

Figure 3B:
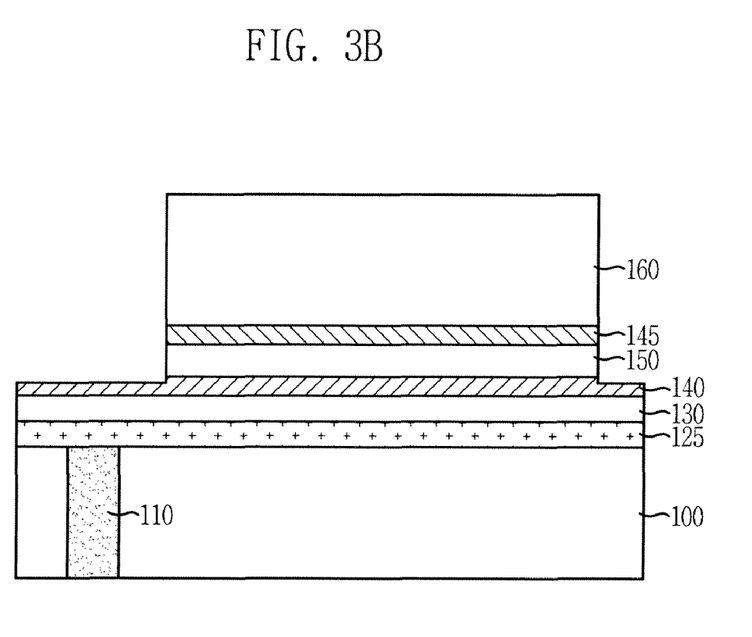

Referring to FIG. 3B, a first photoresist pattern 160 is formed to define an upper electrode of a metal-insulator-metal (MIM) type capacitor. Using the first photoresist pattern 160 as an etch mask, the second nitride-based layer 145 and the upper electrode layer 150 are etched to thereby form a part of a MIM type capacitor. A mixture gas of $C_xF_y/O_2/Ar$, where x and y are natural numbers, or a mixture gas of $CH_pF_q/O_2/Ar$, where p and q are natural numbers is used to etch the second nitride-based layer 145. A mixture gas of $Cl_2/Ar/N_2$ or a mixture gas of $BCl_3/Cl_2/Ar$ is used to etch the upper electrode layer 150.

Figure 3C:
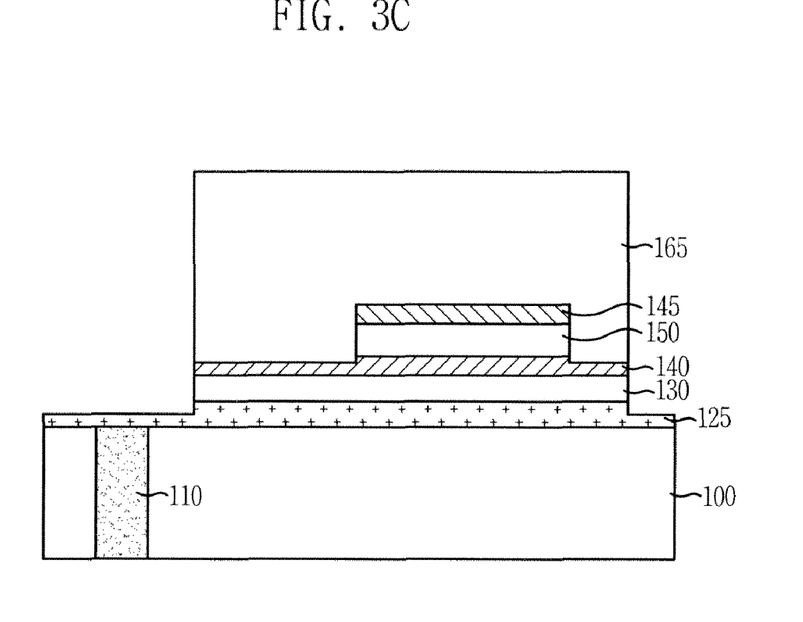

Referring to FIG. 3C, the first photoresist pattern 160 is removed, and a cleaning process is performed thereon. A second photoresist pattern 165 is formed to define a lower electrode of the MIM type capacitor. Using the second photoresist pattern 165 as an etch mask, the dielectric layer 140 and the lower electrode layer 130 are etched. The lower electrode layer 130 is etched using a mixture gas of $Cl_2/Ar/N_2$ or a mixture gas of $BCl_3/Cl_2/Ar$. The dielectric layer 140 is etched using a mixture gas of $C_xF_y/O_2/Ar$, where x and y are natural numbers or a mixture gas of $CH_pF_q/O_2/Ar$, where p and q are natural numbers. The second photoresist pattern 165 is removed using $O_2$ plasma or $O_3$, and afterwards, a wet cleaning process is performed thereon.

Figure 3D:
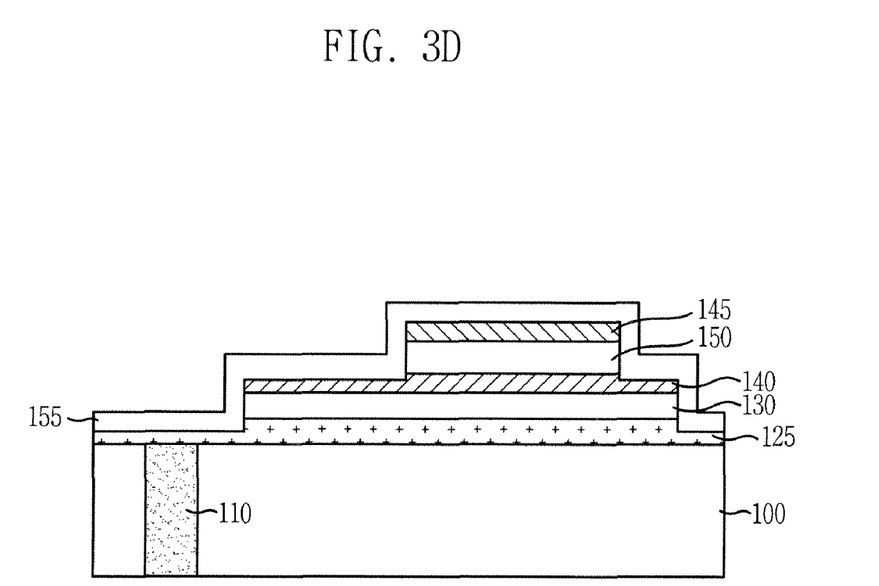

Referring to FIG. 3D, a diffusion barrier layer 155 is formed over the MIM type capacitor covering the inter-layer insulation layer 100. In addition to a function as a barrier, the diffusion barrier layer 155 functions as an etch stop layer when subsequent first metal interconnection lines are formed. Therefore, the diffusion barrier layer 155 includes a material selected from the group consisting of silicon nitride (SiN), silicon carbide (SiC) and oxynitride. In some cases, the formation of the diffusion barrier layer 155 can be omitted.

Figure 3E:
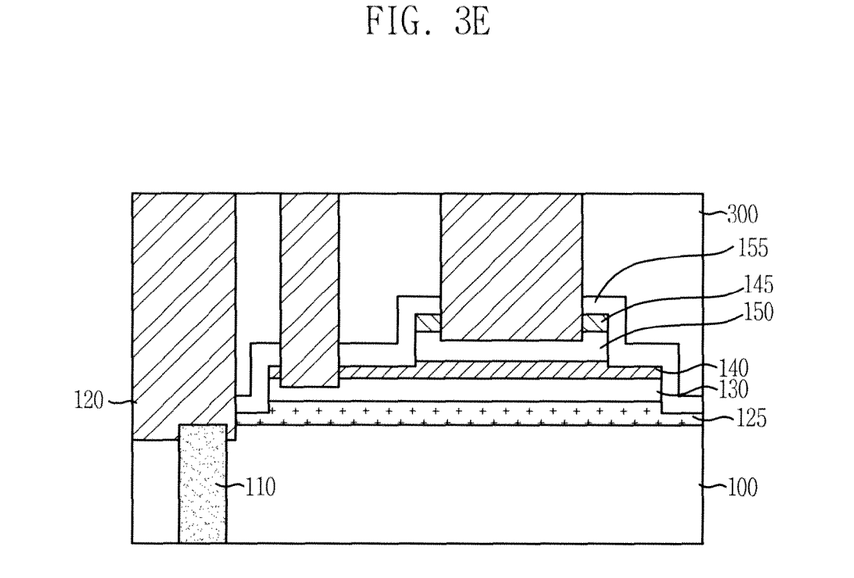

Referring to FIG. 3E, on the diffusion barrier layer 155, an insulation layer 300 and the aforementioned first metal interconnection lines 120 are formed to be connected with the contact plug 110, the MIM type capacitor. It is preferable to form a group of the first metal interconnection lines 120 to be connected individually with the lower electrode layer 130 and the upper electrode layer 150, so that the MIM type capacitor can operate properly.

Figure 3F:
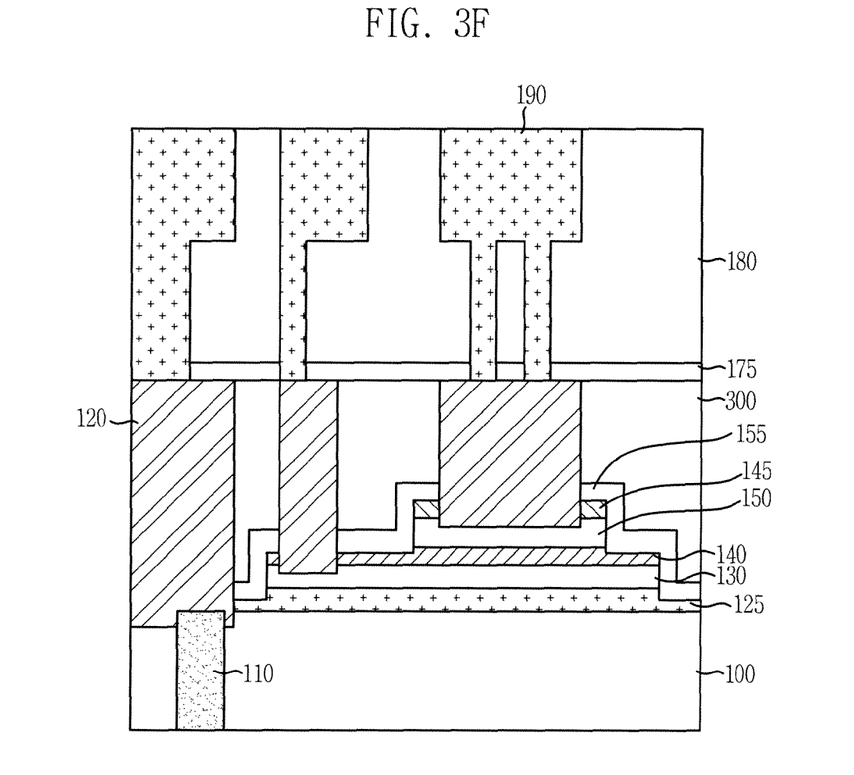

Referring to FIG. 3F, an etch stop layer 175 and an inter-metal insulation layer 180 are sequentially formed on the above resulting structure. Afterwards, a plurality of second metal interconnection lines 190 are formed through performing a damascene process. The etch stop layer 175 prevents an occurrence of a punch-through event at the upper electrode.

According to the specific embodiment of the present invention, by forming the MIM capacitor beneath the metal interconnection lines, it is possible to omit an unnecessary mask process such as formation of overlay keys or alignment keys and to prevent damage on the metal interconnection lines during the etching process for forming the MIM type capacitor.

Since the fabrication process is simplified, a frequency of a defect generation can be reduced and a process margin, which tends to decrease due to a height difference created after the MIM type capacitor formation, can be sufficiently secured. Also, because of the simplified fabrication process, it is possible to reduce manufacturing costs and improve device reliability.

The present application contains subject matter related to the Korean patent application No. KR 2004-0116971, filed in the Korean Patent Office on Dec. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed:

1. A semiconductor device, comprising:
   an inter-layer insulation layer;
   a contact plug formed in the inter-layer insulation layer,
   a first etch stop layer on the inter-layer insulation layer,
   a capacitor including a lower electrode, a dielectric layer and an upper electrode formed on the first etch stop layer;
   a hard mask layer on the upper electrode;
   a barrier layer covering both sides of the lower electrode and the upper electrode;
   an insulation layer formed on the barrier layer; and
   a first metal interconnection line formed in the insulation layer and directly connected to the contact plug,
   wherein the barrier layer contacts with the first etch stop layer,
   wherein the hard mask layer includes one of a silicon nitride and a silicon oxynitride,
   wherein the barrier layer contacts with a top surface of the hard mask layer and a top surface of the dielectric layer.

2. The semiconductor device of claim 1, further including:
   a second etch stop layer formed over the insulation layer;
   an inter-metal insulation layer formed over the second etch stop layer; and
   a plurality of second metal interconnection lines.

3. The semiconductor device of claim 1, wherein the lower electrode and the upper electrode include a material selected from the group consisting of TIN, TaN, Al, W, and Cu.

4. The semiconductor device of claim 1, wherein the dielectric layer includes a material selected from the group consisting of silicon oxide, silicon nitride or silicon oxynitride.

5. The semiconductor device of claim 1, wherein the first metal interconnection line is formed by penetrating a stack of the barrier layer and the first etch stop layer.

6. The semiconductor device of claim 1, wherein the contact plug comprises a tungsten.

7. The semiconductor device of claim 1, wherein the contact plug has width narrower than that of the first metal interconnection line.

8. The semiconductor device of claim 1, the first etch stop layer comprises a silicon nitride-based layer.

9. A semiconductor device, comprising:
   an inter-layering insulation layer;

a contact plug formed in the inter-layer insulation layer,
a first etch stop layer on the inter-layer insulation layer,
a capacitor including a lower electrode, a dielectric layer and an upper electrode formed on the first etch stop layer;
a hard mask layer on the upper electrode,
wherein the hard mask layer includes one of a silicon nitride or a silicon oxynitride;
a barrier layer covering both sides of the lower electrode and the upper electrode,
wherein the barrier layer contacts with the first etch stop layer,
wherein the barrier layer includes a material selected from the group consisting of silicon nitride, silicon carbide or silicon oxynitride, and
wherein the barrier layer contacts with the top surface of the hard mask layer and the top surface of the dielectric layer;
an insulation layer formed on the barrier layer; and
a first metal interconnection line formed in the insulation layer and directly connected to the contact plug.

10. A semiconductor device including a capacitor, comprising:
an inter-layer insulation layer;
a contact plug formed in the inter-layer insulation layer,
a etch stop layer on the inter-layer insulation layer,
a lower electrode, a dielectric layer and an upper electrode formed on the etch stop layer;
a hard mask layer formed on the upper electrode
a barrier layer formed on side surface of the lower electrode, side surface of the upper electrode and top surface of the hard mask layer and top surface of the dielectric layer,
an insulation layer formed on the barrier layer; and
a first metal interconnection line formed in the insulation layer and directly connected to the contact plug,
wherein the thickness of the etch stop layer under the lower electrode is thicker than the thickness of the etch stop layer under the barrier layer,
wherein the thickness of the dielectric layer under the upper electrode is thicker than the thickness of the dielectric layer under the barrier layer.

11. The semiconductor device of claim 10, wherein the lower electrode and the upper electrode include a material selected from the group consisting of TiN, TaN, Al, W, and Cu.

12. The semiconductor device of claim 10, wherein the dielectric layer includes a material selected from the group consisting of silicon oxide, silicon nitride or silicon oxynitride.

13. The semiconductor device of claim 10, wherein the hard mask layer includes one of a silicon nitride or an silicon oxynitride.

* * * * *

UNITED STATES PATENT AND TRADEMARK OFFICE
CERTIFICATE OF CORRECTION

PATENT NO. : 8,310,026 B2
APPLICATION NO. : 12/690813
DATED : November 13, 2012
INVENTOR(S) : Jin-Youn Cho It is certified that error appears in the above-identified patent and that said Letters Patent is hereby corrected as shown below:

In the Claims:

Column 6, Claim 3, line 51, please delete "TIN" and insert --TiN--.

Signed and Sealed this
Eighteenth Day of June, 2013

Teresa Stanek Rea
*Acting Director of the United States Patent and Trademark Office*